United States Patent
Cam et al.

(10) Patent No.: US 9,564,860 B2
(45) Date of Patent: Feb. 7, 2017

(54) MULTIMODE OPERATION FOR DIFFERENTIAL POWER AMPLIFIERS

(71) Applicant: ACCO, Louveciennes (FR)

(72) Inventors: Hervé Cam, Cernay la Ville (FR); Pascal Reynier, Paris (FR); Emmanuel Picard, Vanves (FR)

(73) Assignee: ACCO, Louveciennes (FR)

( * ) Notice: Subject to any disclaimer, the term of this patent is extended or adjusted under 35 U.S.C. 154(b) by 0 days.

(21) Appl. No.: 14/751,495

(22) Filed: Jun. 26, 2015

(65) Prior Publication Data

US 2016/0380601 A1    Dec. 29, 2016

(51) Int. Cl.

| | |
|---|---|
| *H03F 3/45* | (2006.01) |
| *H03F 1/56* | (2006.01) |
| *H03F 3/19* | (2006.01) |
| *H03F 3/21* | (2006.01) |
| *H04B 1/04* | (2006.01) |
| *H04L 5/14* | (2006.01) |

(52) U.S. Cl.
CPC ........ *H03F 1/56* (2013.01); *H03F 3/19* (2013.01); *H03F 3/211* (2013.01); *H03F 3/45076* (2013.01); *H04B 1/0475* (2013.01); *H04L 5/14* (2013.01); *H03F 2200/451* (2013.01); *H03F 2203/21142* (2013.01); *H04B 2001/0408* (2013.01)

(58) Field of Classification Search
CPC ........ H03F 1/56; H03F 3/211; H03F 3/45076; H03F 2200/451; H03F 2203/21142; H04B 1/0475; H04B 2001/0408; H04L 5/14
USPC ....... 330/116, 117, 124 R, 275, 301; 333/25, 333/26, 32; 343/849, 859–861, 865, 876
See application file for complete search history.

(56) References Cited

U.S. PATENT DOCUMENTS

| | | | |
|---|---|---|---|
| 3,129,393 A | 4/1964 | Coleman | |
| 8,427,241 B2 | 4/2013 | Ezzeddine et al. | |
| 2004/0017266 A1* | 1/2004 | Zhao | H03H 7/42 333/26 |
| 2007/0243832 A1* | 10/2007 | Park | H04B 1/006 455/73 |
| 2011/0128088 A1* | 6/2011 | Jin | H03H 7/38 333/25 |
| 2013/0106507 A1 | 5/2013 | Signoff et al. | |

FOREIGN PATENT DOCUMENTS

WO    2013/001743 A1    1/2013

OTHER PUBLICATIONS

AN369, "Si4010 Antenna Interface and Matching Network Guide", Rev. 0.2 4/11, 2011 by Silicon Laboratories.*

(Continued)

*Primary Examiner* — Steven J Mottola
*Assistant Examiner* — Hafizur Rahman
(74) *Attorney, Agent, or Firm* — Royse Law Firm, PC

(57) ABSTRACT

An RF circuit for wireless devices comprises a single differential power amplifier and an impedance balancing circuit for each frequency band. The impedance balancing circuit serves both to provide an appropriate impedance at the output of the amplifier as the operating mode of the device changes, and also transforms the differential output of the amplifier to a single-ended output. The impedance balancing circuit optionally comprises a BALUN circuit and a variable capacitor that is varied as the operating mode changes in order to vary the impedance at the output of the amplifier.

13 Claims, 5 Drawing Sheets

(56) References Cited

OTHER PUBLICATIONS

Andrei Grebennikov, "Power Combiners, Impedance Transformers and Directional Couplers", High Frequency Electronics, Dec. 2007, pp. 20-38.*
Willmar K. Roberts, A"New Wide-Band Balun," 1Proceedings of the IRE, 957.
U.S. Appl. No. 14/493,695, filed Sep. 23, 2014, Hervé Cam, Body Biasing for RF Switch Optimization.
U.S. Appl. No. 14/930,185, filed Feb. 11, 2015, Christophe Boyavalle, Capacitive Cross-Coupling and Harmonic Rejection.
U.S. Appl. No. 14/979,337, filed Dec. 22, 2015, Denis Masliah, Electronic Circuits Including a MOSFET and a Dual-Gate JFET.
EPO 16166839.7 Partial European Search Report, mailed Nov. 16, 2016.

* cited by examiner

MULTIMODE OPERATION FOR DIFFERENTIAL POWER AMPLIFIERS

BACKGROUND

Field of Invention

The present invention relates generally to RF circuits and more particularly to a circuit that transforms a differential output signal received from a differential power amplifier into a single-ended output signal, where the impedance applied to the differential power amplifier by the circuit can be tuned for multiple operating modes so that a single differential power amplifier can be used for several operating modes operating within a given frequency band.

Related Art

FIG. 1 illustrates a prior art RF circuit 100 coupled to an antenna 110. The circuit 100 comprises a number of transit paths 120 and an antenna switch 130 that couples the antenna 110 to the several transit paths 120. Each transit path 120 includes a power amplifier 140 and a receiver amplifier 150 alternately joined to the antenna switch 130 by a duplexer 160. Within the antenna switch 130, each transit path 120 is switchably coupled to the antenna 110 by a series switch 170 and optionally also switchably coupled to ground by a parallel switch 180.

As shown in FIG. 1, when one transit path 120 is coupled to the antenna 110 (said to be in the ON mode), the series switch 170 for that transit path 120 is closed while the parallel switch 180 is open, whereas the switches 170, 180 are reversed for all other transit paths 120 (OFF mode). While the antenna switch 130 will work with only the serial switches 170, the addition of the parallel switches 180 provides greater isolation by grounding the transit paths 120 that are not in use.

In a cellular telephone, the various transit paths 120 are provided to accommodate different operating modes, where each operating mode is a different combination of frequency band and power level, where the telephone can switch between operating modes depending on changes in the country, the operator, the traffic, and so forth. As shown in FIG. 1, having multiple operating modes can be achieved by using as many power amplifiers 140 as the number of operating modes such that every power amplifier 140 is optimized for its specific frequency band and power level.

SUMMARY

An exemplary device of the present invention comprises a wireless RF device such as a cellular telephone or smartphone and is operable in at least one frequency band and is switchable between a number of operating modes in each of the frequency bands. The exemplary device includes an antenna and an antenna switch, a plurality of receiver amplifiers, each receiver amplifier of the plurality dedicated to a different operating mode of the number of operating modes, an impedance balancing circuit, and a first differential power amplifier configured to operate within a first frequency band of the at least one frequency band. Additional frequency bands can be served with additional pairs of differential power amplifiers and impedance balancing circuits, each pair having a separate plurality of receiver amplifiers but sharing the same antenna as the first differential power amplifier.

The differential power amplifier includes an input and an output, and is configured to receive a differential input signal at the input and to produce an amplified differential output signal at the output from the differential input signal. As noted above, the first differential power amplifier is configured to operate within a first frequency band; moreover, the first differential power amplifier may be solely dedicated to the first frequency band.

The impedance balancing circuit is in electrical communication with the first differential power amplifier and is configured to receive the differential output signal from the output of the first differential power amplifier and further configured to produce a single-ended output signal from the differential output signal. The impedance balancing circuit is also tunable to change an impedance applied to the output of the first differential power amplifier as the operating mode is switched. The antenna switch is configured to alternatingly couple the antenna to either the first impedance balancing circuit or to couple the antenna to the plurality of receiver amplifiers. In some embodiments, the antenna switch alternatingly couples the antenna to either the first impedance balancing circuit or to the plurality of receiver amplifiers by coupling the antenna to a duplexer coupled to both the mode switch and one receiver amplifier of the plurality of receiver amplifiers.

Various embodiments further comprise a mode switch and a number of duplexers equal to the number of receiver amplifiers in the plurality of receiver amplifiers. In these embodiments the mode switch is in electrical communication with the impedance balancing circuit and configured to receive the single-ended output signal therefrom. Also, each duplexer of the number of duplexers is in electrical communication between the antenna switch and either the mode switch or one receiver amplifier of the plurality of receiver amplifiers. Thus, when the operating mode changes and the input impedance changes, the mode switch couples the impedance balancing circuit to a different duplexer, and the antenna switch can select the same duplexer.

In various embodiments the impedance balancing circuit comprises a BALUN (for BALanced/UNbalanced) circuit and a variable capacitor. The BALUN circuit itself comprises a first transmission line and a second transmission line, where each of the two transmission lines has a first end and a second end. In some embodiments the transmission lines comprise planar structures such as microstrips. In various embodiments, each transmission line is comprised of an electrically conductive strip, a ground plane adjacent to the electrically conductive strip, and a dielectric layer disposed between the electrically conductive strip and the ground plane. In these embodiments the ground plane has a width that is greater than a width of the electrically conductive strip. In operation, a differential output signal is applied across the ground planes of the two transmission lines at the respective first ends thereof. The impedance balancing circuit also comprises a first electrical connection joining the electrically conductive strips of the two transmission lines at the first ends thereof. The impedance balancing circuit also comprises a second electrical connection joining the ground planes of the two transmission lines at the second ends thereof. This second electrical connection can be either coupled to ground or to a DC bias voltage, in various embodiments. Additionally, the first impedance balancing circuit is configured to produce the single-ended output signal from the electrically conductive strip of the first transmission line at the second end thereof. The variable capacitor is electrically coupled to the electrically conductive strip of the second transmission line at the second end thereof.

Various embodiments of the device can serve two or more frequency bands such as a high frequency band and a low frequency band. Thus, some embodiments include a second differential power amplifier, having an input and an output, and configured to operate within a second frequency band of the at least one frequency band and further configured to produce an amplified differential output signal at the output from a differential input signal received at the input, the second differential power amplifier being solely dedicated to the second frequency band. Also in these embodiments, a second impedance balancing circuit is in electrical communication with the second differential power amplifier and is configured to receive the differential output signal from the output of the second differential power amplifier and further configured to produce a single-ended output signal from the differential output signal. The second impedance balancing circuit is also tunable to change an impedance applied to the output of the second differential power amplifier as the operating mode is switched.

The present invention is also directed to circuits for use in the devices described above. An exemplary circuit comprises a differential power amplifier configured to produce a differential output signal, an impedance balancing circuit, and a variable capacitor. In these embodiments, the impedance balancing circuit is electrically coupled to the differential amplifier and configured to receive the differential output signal therefrom. Additionally, the impedance balancing circuit includes a first transmission line and a second transmission line, each of the two transmission lines having a first end and a second end. Further, each transmission line comprises an electrically conductive strip, a ground plane adjacent to the electrically conductive strip, and a dielectric layer disposed between the electrically conductive strip and the ground plane, the ground plane being characterized by a width that is greater than a width of the electrically conductive strip, wherein the differential output signal is applied across the ground planes of the two transmission lines at the respective first ends thereof. A first electrical connection, which optionally can be a via or transmission line, joins the electrically conductive strips of the two transmission lines at the first ends thereof. A second electrical connection, which also optionally can be a via or transmission line, joins the ground planes of the two transmission lines at the second ends thereof. The second electrical connection can be either coupled to ground or to a DC bias voltage, in different embodiments. The impedance balancing circuit is configured to produce a single-ended output signal from the electrically conductive strip of the first transmission line at the second end thereof. The variable capacitor is electrically coupled to the electrically conductive strip of the second transmission line at the second end thereof.

Various embodiments of the circuit further comprising a mode switch electrically coupled to receive the single-ended output signal from the impedance balancing circuit and configured to switch the single-ended output signal between a plurality of output ports. Some of these embodiments further comprise a number of duplexers, where one duplexer of the number of duplexers is electrically coupled to each output port of the plurality of output ports.

DETAILED DESCRIPTION

The present invention describes an RF circuit comprising a differential power amplifier and an impedance balancing circuit for use with multiple operating modes such as 3G and 4G. The impedance balancing circuit serves to transform a differential signal output from the differential power amplifier into a single-ended output and also serves to provide an impedance at the output of the differential power amplifier that varies according to changes in the operating mode. This allows a single differential power amplifier to be used for multiple operating modes within a given frequency band.

In various embodiments, the impedance balancing circuit includes a BALUN circuit. The BALUN circuit includes a pair of transmission lines, where the differential output signal is applied across the two transmission lines at one end to produce a single-ended output signal from one of the transmission lines at the opposite end. These embodiments can further include a variable capacitor coupled to the second transmission line at the same end that the single-ended output signal is produced. Varying the capacitance of the variable capacitor serves to vary the impedance of the BALUN circuit at the end that the differential output signal is applied to accommodate different operating modes.

Figure 1:
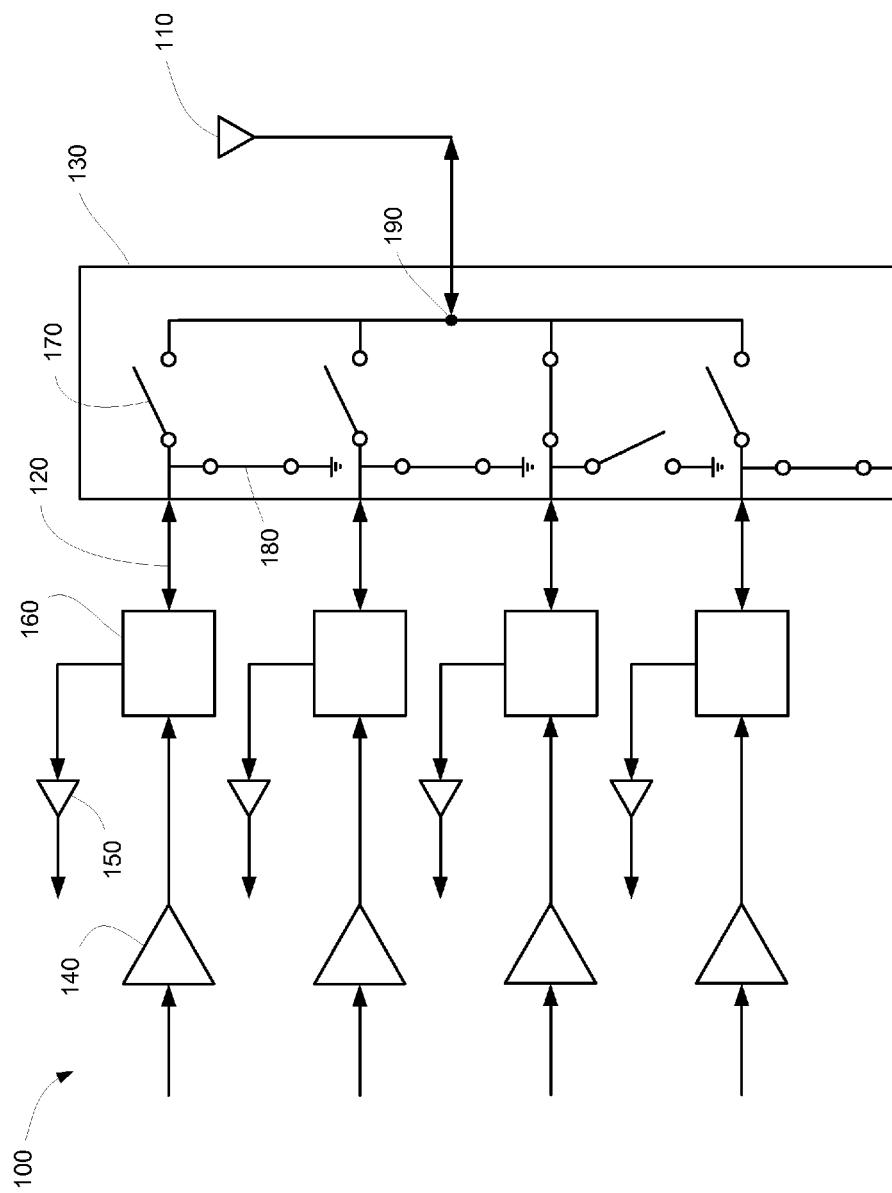
FIG. 1 is a schematic representation of RF circuit according to the prior art.
Figure 2:
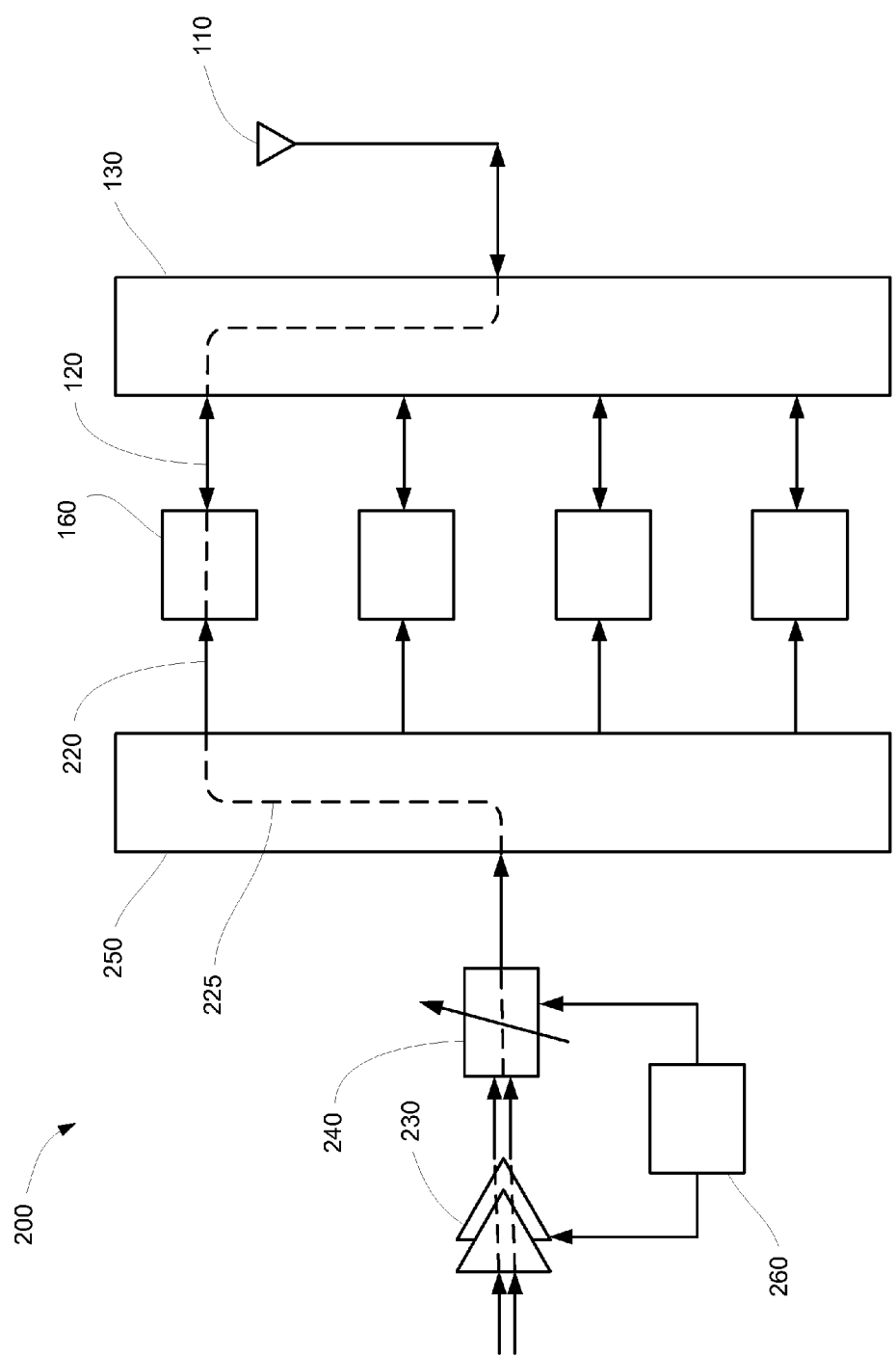
FIG. 2 is a schematic representation of RF circuit according to an exemplary embodiment of the present invention.

FIG. 2 illustrates an exemplary RF circuit 200 of the present invention coupled to an antenna 110. The circuit 200 can be included as part of a device such as a wireless telephone, for example. The circuit 200 comprises a number of transit paths 220 and an antenna switch 130 that couples the antenna 110 to the several transit paths 220. Each transit path 220 includes a pathway 225 through a single, shared differential power amplifier 230, a shared impedance balancing circuit 240, and through a mode switch 250 to one of several outputs of the mode switch 250 joined to the antenna switch 130 by a duplexer 160; the transit path 220 also includes a receiver amplifier 150 (omitted for clarity from FIG. 2) alternately coupled to the antenna switch 130 by the duplexer 160 as shown in FIG. 1.

In some embodiments the differential power amplifier 230 is solely dedicated to a given frequency band, such as a high frequency band or a low frequency band, and the several transit paths 220 are for a number of different power levels. A telephone can include several differential power amplifiers 230, one dedicated for each band, where each such differential power amplifier 230 has a dedicated impedance balancing circuit 240. In embodiments that include multiple differential power amplifiers 230, each power amplifier 230 and balancing circuit 240 pair can have a separate mode switch 250 or can be joined to a common mode switch 250. The mode switch 250 includes a number of switches analogous in arrangement to the antenna switch 130 illustrated in FIG. 1. It should be noted that frequency bands may partially overlap and the presence of another differential power amplifier serving a second frequency band that partially overlaps the given frequency band would not disqualify the first differential power amplifier from being "solely dedicated to the given frequency band" nor would the second differential power amplifier be "solely dedicated to the given frequency band" since it does not cover all of the given frequency band.

In FIG. 2, the input and output of the differential power amplifier 230 are both illustrated with two parallel lines to signify that the differential power amplifier 230 receives two input signals (also referred to herein as a differential input signal), amplifies the voltage difference between the input signals, and produces a differential output signal across a pair of leads. The impedance balancing circuit 240 is in electrical communication with the differential power amplifier 230, thus, the electrical communication between the impedance balancing circuit 240 and the differential power amplifier 230 can be provided by a pair of leads, wires, traces, or other two electrical conductors.

The impedance balancing circuit 240 receives the differential output signal from the differential power amplifier 230 and produces a single-ended output signal therefrom. The choice of operating mode can affect the impedance presented at the output of the differential power amplifier 230. The impedance balancing circuit 240 provides an impedance at the output of the differential power amplifier 230 that is appropriate for the given operating mode, and the impedance balancing circuit 240 can also bias the differential power amplifier 230. The differential power amplifier 230 requires a specific load to be able attain the required output power, and the output power is a proportional to the square of the bias voltage divided by twice the resistance. The resistance, in this relationship, is the single-ended output load of the impedance balancing circuit 240.

The RF circuit 200 additionally comprises a controller 260 configured to send a digital signal to the differential power amplifier 230 to specify an operating mode. At the same time, the controller 260 similarly controls the impedance balancing circuit 240 to vary the impedance at the output of the differential power amplifier 230.

Figure 3:
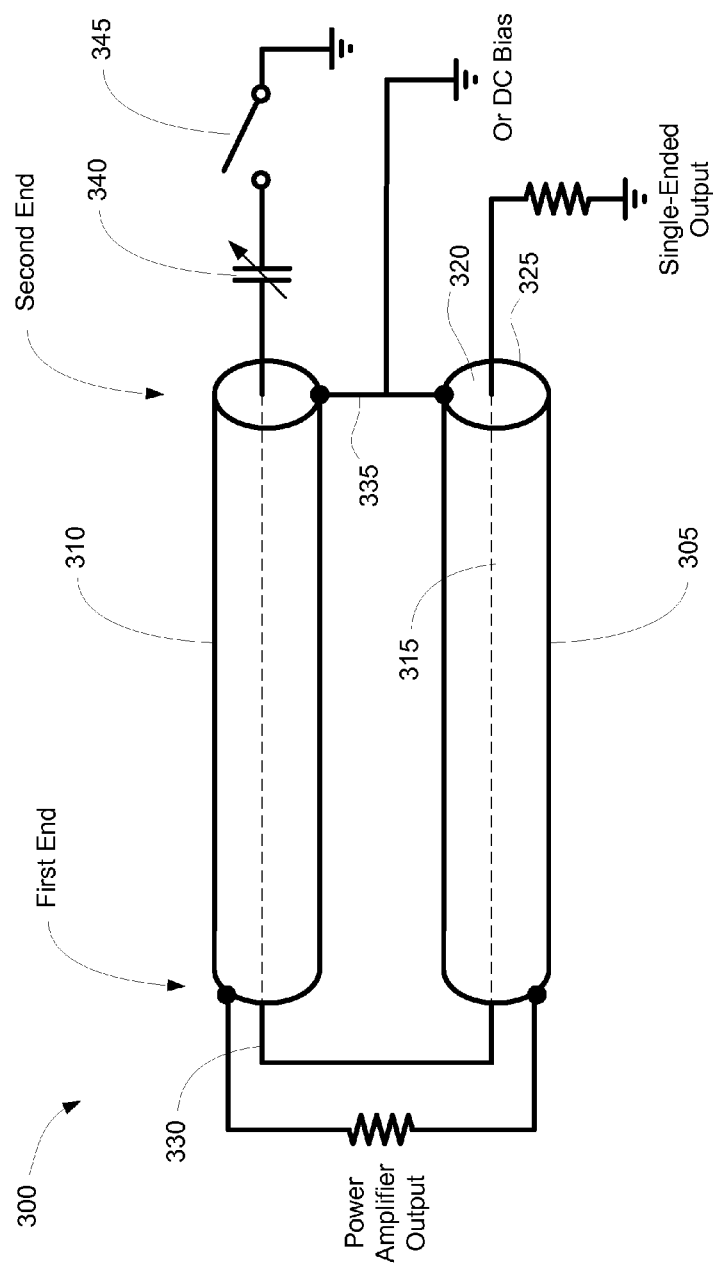
FIG. 3 is an explanatory representation of an impedance balancing circuit, for use in the RF circuit of FIG. 2, according to an exemplary embodiment of the present invention.

FIG. 3 provides an explanatory illustration of a BALUN circuit 300 to show one way in which an impedance balancing circuit 240 can transform a differential output signal into a single-ended output signal. The BALUN circuit 300 illustrated by FIG. 3 employs coaxial transmission lines, for simplicity of understanding, but embodiments of the present invention do not use coaxial transmission lines but rather use planar structures that can be fabricated with traditional semiconductor fabrication techniques as described with respect to FIGS. 4 and 5, below.

The BALUN circuit 300 is characterized by a first length 305 of a coaxial transmission line and a second length 310 of the coaxial transmission line, each of the two coaxial transmission lines 305, 310 being characterized by a first end and a second end, the two coaxial transmission lines 305, 310 being disposed alongside one another in a parallel arrangement, as shown. The coaxial transmission line itself is comprised of an electrically conductive core 315, a dielectric insulation layer 320 surrounding the core 315, and an electrically conductive shield layer 325 surrounding the dielectric insulation layer 320.

The BALUN circuit 300 also includes an electrical connection 330 that joins the cores 315 of the two coaxial transmission lines 305, 310 at the first ends thereof. The core 315 of the first coaxial transmission 305 line is additionally joined to ground at the second end thereof. At the second end, the shield layers 325 are shorted together by an electrical connection 335. FIG. 3 also illustrates a variable capacitor 340 having one end electrically joined to the core 315 of the second coaxial transmission line 310 at the second end thereof. A switch 345 couples the opposite end of the capacitor 340 to ground. Switch 345 can be a silicon-on-insulator (SOI) switch in some embodiments. More specifically, in some embodiments the variable capacitor 340 consists of a number of capacitors in parallel, each having an SOI switch to ground and the capacitance of the variable capacitor 340 is changed through the operation of the SOI switches.

The electrical communication between the differential power amplifier 230 and the BALUN circuit 300 is configured to provide the differential output across the shield layers 325 of the two lengths 305, 310 of the coaxial transmission line at the respective first ends thereof. The differential output of the differential power amplifier 230 comprises a load represented in FIG. 3 as a resistor disposed between the two shield layers 325 at the first end.

The BALUN circuit 300 produces a single-ended output from the shield layer 325 of the first coaxial transmission line 305 at the second end of the first coaxial transmission line 305, as shown in FIG. 3. The single-ended output also comprises a load, and is also represented by a resistor in FIG. 3. In some embodiments, the single-ended output load is about 50Ω. When the lengths of each transmission line 305, 310 of the BALUN circuit 300 is one quarter of the wavelength of the differential output signal, the short provided by the electrical connection 335 creates a perfect open circuit. It should be noted that the length of a quarter wave in the RF frequency domain is too big to be implemented in the geometries used in RF devices, but fortunately this phenomenon is not very sensitive to deviations from the quarter wavelength and therefore the lengths of the transmission lines 305, 310 can be either shorter or longer than a quarter wavelength. In some embodiments, the lengths of the transmission lines 305, 310 can be shorter by $\frac{1}{16}^{th}$ of the wavelength, or even shorter.

By connecting the second coaxial transmission line 310 to the variable capacitance provided by capacitor 340, the impedance at the second end of the second length 310 can be controlled. By tuning the capacitance of the capacitor 340, the BALUN circuit 300 can provide different impedances to the differential power amplifier 230 that are compatible, for example, with either of the 2G and 3G operating modes.

As noted above, the impedance balancing circuit 240 of FIG. 2 can bias the differential power amplifier 230. In the BALUN circuit 300, a DC bias voltage can be applied to the first coaxial transmission line 305 at the second end thereof, in place of the connection to ground shown in FIG. 3. A decoupling capacitor (not shown) in parallel maintains this point "cold."

Figure 4:
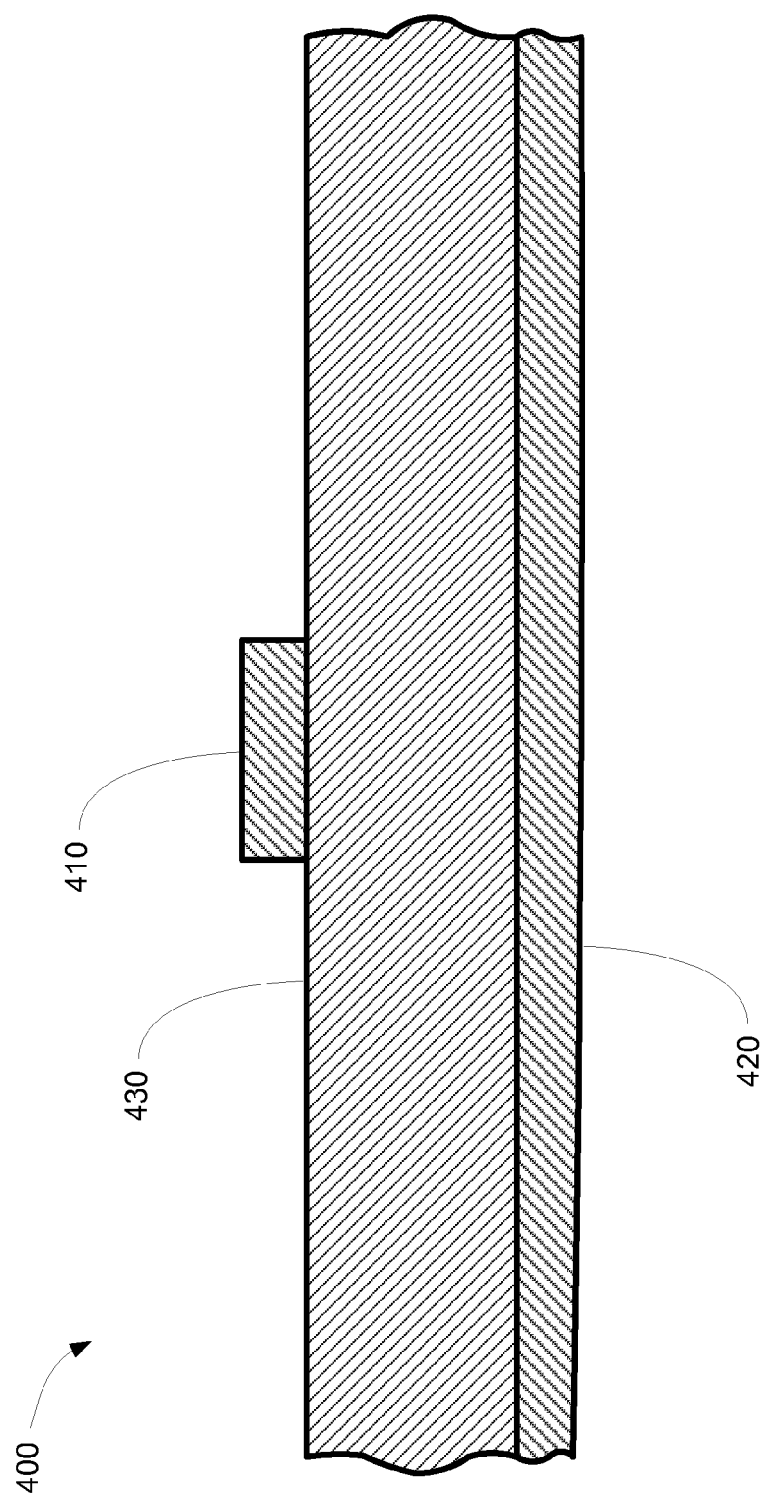
FIG. 4 is a cross-sectional representation of a microstrip transmission line for use in an exemplary embodiment of an impedance balancing circuit.

As noted above, embodiments of the present invention do not employ coaxial cables. Instead, embodiments of the present invention employ planar transmission lines such as the one illustrated by FIG. 4. The exemplary transmission line 400 of FIG. 4 is an example of a microstrip. The use herein of the term "microstrip" is limited to the art-recognized meaning of a planar structure comprising an electrically conductive strip 410, characterized by a first width and first thickness, and a wider electrically conductive ground plane 420, separated by a dielectric layer 430 characterized by a second thickness. Suitable microstrips can be embedded or coated, in various embodiments. Other planar transmission lines, such as a stripline, can also be used. With reference to FIG. 3 it can be seen how two microstrips can replace the two lengths 305, 310 where the electrically conductive strips 410 take the place of the cores 315 and the ground planes 420 take the place of the shield layers 325.

Figure 5:
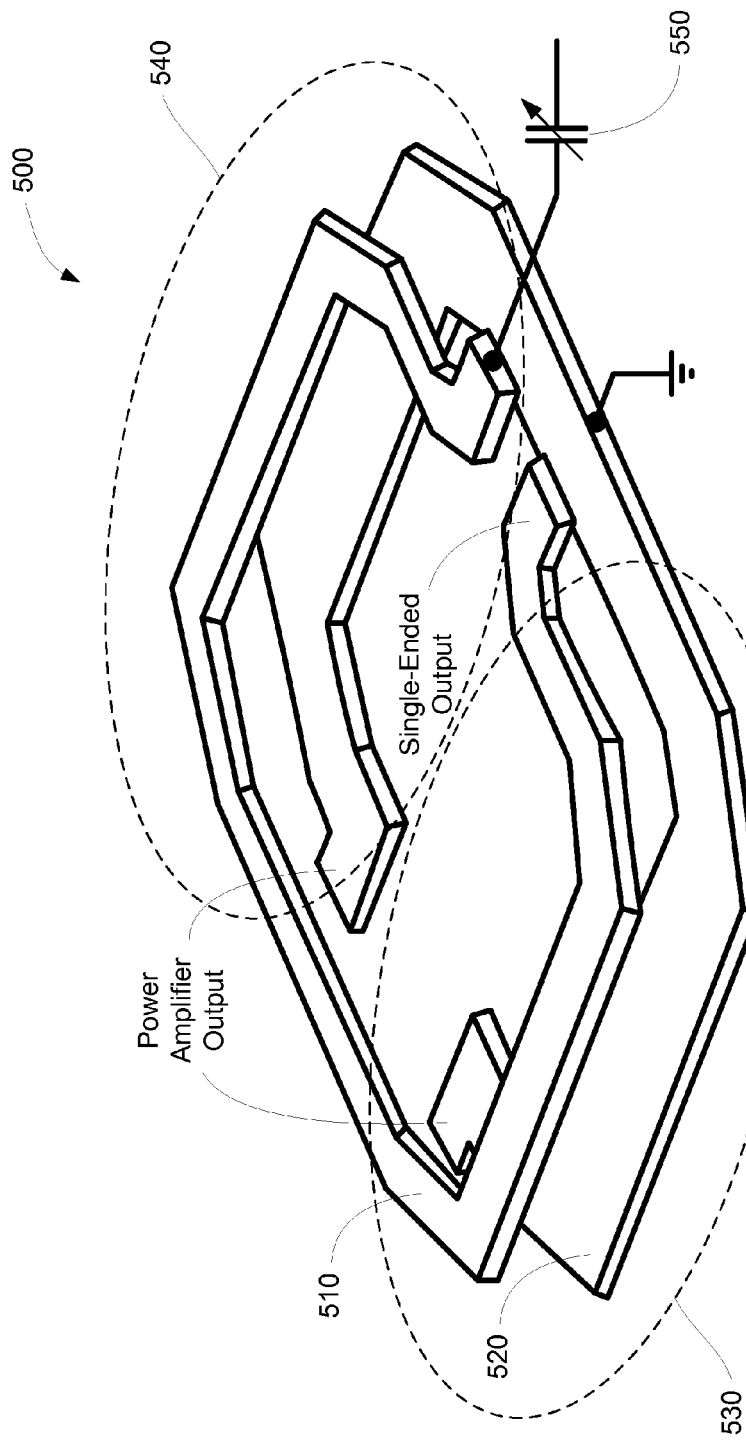
FIG. 5 is a perspective view of a schematic representation of an impedance balancing circuit according to an exemplary embodiment of the present invention.

FIG. 5 is a perspective view of a schematic representation of an impedance balancing circuit 500 comprising a microstrip including an upper conductor 510 and a lower conductor 520 corresponding to the cores 315 and shields 325 of the coaxial transmission lines 305, 310 of FIG. 3, respectively. The upper conductor 510 can also be viewed as an electrically conductive strip, while the lower conductor 520 can be viewed as a ground plane. The impedance balancing circuit 500 can be used in various embodiments of RF circuit 200 as the impedance balancing circuit 240. Other planar transmission line structures can be similarly arranged to produce other suitable impedance balancing circuit 240 embodiments. In the impedance balancing circuit 500 of FIG. 5, only the two conductors 510, 520 are shown; dielectric insulation, contacts, and connecting vias have been omitted for clarity.

The proportions of the features shown in FIG. 5 are not to scale, however, the drawing does illustrate that the lower conductor 520 is characterized by a greater width than the upper conductor 510, and further, that the upper conductor 510 and lower conductor 520 form two transmissions lines 530, 540 in the two regions where the upper conductor 510 is aligned with the lower conductor 520. Each conductor 510, 520 forms a loop with an opening, and the two conductors 510, 520 are arranged such that their openings are set opposite one another.

The impedance balancing circuit 500 is arranged similarly to the arrangement of the BALUN circuit 300 in FIG. 3. Here, the differential output signal of the power amplifier 230 is applied across the opening of the lower conductor 520, as shown, while the single-ended output signal is obtained from the upper conductor 510 of transmission line 530 adjacent to the opening in the upper conductor 510. The lower conductor 520 is grounded along a portion thereof disposed between the two transmission lines 530, 540. Alternately, a DC bias voltage can be applied at this point, as discussed above with respect to FIG. 3. Across the opening in the upper conductor 510 from where the single-ended output signal is obtained, the transmission line 540 is coupled to a variable capacitor 550. The capacitance of the variable capacitor 550 is varied in order to adjust the impedance of the impedance balancing circuit 500.

In the foregoing specification, the invention is described with reference to specific embodiments thereof, but those skilled in the art will recognize that the invention is not limited thereto. Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive. It will be recognized that the terms "comprising," "including," and "having," as used herein, are specifically intended to be read as open-ended terms of art. The term "connect" is differentiated herein from the term "couple" such that when two components are "connected" there are no other components disposed between them, whereas when two components are "coupled" there may be other components disposed between them. "Electrically coupled" is likewise differentiated from "electrically connected," and the terms "electrically joined" and "in electrical communication" are to be viewed as interchangeable with "electrically coupled."

What is claimed is:

1. A circuit comprising:
    a differential power amplifier configured to produce a differential output signal;
    an impedance balancing circuit electrically coupled to the differential amplifier and configured to receive the differential output signal therefrom, the impedance balancing circuit including
        a first transmission line and a second transmission line, each of the two transmission lines having a first end and a second end,
        each transmission line comprising an electrically conductive strip, a ground plane adjacent to the electrically conductive strip, and a dielectric layer disposed between the electrically conductive strip and the ground plane, the ground plane being characterized by a width that is greater than a width of the electrically conductive strip, wherein the differential output signal is applied across the ground planes of the two transmission lines at the respective first ends thereof,
        a first electrical connection joining the electrically conductive strips of the two transmission lines at the first ends thereof,
        a second electrical connection joining the ground planes of the two transmission lines at the second ends thereof,
        the impedance balancing circuit configured to produce a single-ended output signal from the electrically conductive strip of the first transmission line at the second end thereof; and
    a variable capacitor electrically coupled to the electrically conductive strip of the second transmission line at the second end thereof.

2. The circuit of claim 1 wherein each transmission line comprises a microstrip.

3. The circuit of claim 1 further comprising a mode switch electrically coupled to receive the single-ended output signal from the impedance balancing circuit and configured to switch the single-ended output signal between a plurality of output ports.

4. The circuit of claim 3 further comprising a number of duplexers, one duplexer of the number of duplexers electrically coupled to each output port of the plurality of output ports.

5. The circuit of claim 1 wherein the second electrical connection joining the ground planes of the two transmission lines at the second ends thereof is additionally coupled to ground.

6. The circuit of claim 1 wherein the second electrical connection joining the ground planes of the two transmission lines at the second ends thereof is additionally coupled to a DC bias voltage.

7. A device operable in at least one frequency band and being switchable between a number of operating modes in each of the frequency bands, the device comprising:
    an antenna;
    a plurality of receiver amplifiers, each receiver amplifier of the plurality dedicated to a different operating mode of the number of operating modes;
    a first differential power amplifier, having an input and an output, and configured to operate within a first frequency band of the at least one frequency band and further configured to produce an amplified differential output signal at the output from a differential input signal received at the input, the first differential power amplifier being solely dedicated to the first frequency band;
    a first impedance balancing circuit in electrical communication with the first differential power amplifier and configured to receive the differential output signal from the output of the first differential power amplifier and further configured to produce a single-ended output signal from the differential output signal, the first impedance balancing circuit being tunable to change an impedance applied to the output of the first differential power amplifier as the operating mode is switched;

an antenna switch configured to alternatingly couple the antenna to either the first impedance balancing circuit or to couple the antenna to the plurality of receiver amplifiers.

8. The device of claim 7 further comprising a mode switch and a number of duplexers equal to the plurality of receiver amplifiers, wherein the mode switch is in electrical communication with the first impedance balancing circuit and configured to receive the single-ended output signal therefrom, each duplexer of the number of duplexers being configured to alternatingly couple the antenna switch to either the mode switch or to couple the antenna switch to one receiver amplifier of the plurality of receiver amplifiers.

9. The device of claim 7 wherein the first impedance balancing circuit comprises
- a first transmission line and a second transmission line, each of the two transmission lines having a first end and a second end,
- each transmission line being comprised of an electrically conductive strip, a ground plane adjacent to the electrically conductive strip, and a dielectric layer disposed between the electrically conductive strip and the ground plane, the ground plane being characterized by a width that is greater than a width of the electrically conductive strip, wherein the differential output signal is applied across the ground planes of the two transmission lines at the respective first ends thereof,
- a first electrical connection joining the electrically conductive strips of the two transmission lines at the first ends thereof,
- a second electrical connection joining the ground planes of the two transmission lines at the second ends thereof, the first impedance balancing circuit being configured to produce the single-ended output signal from the electrically conductive strip of the first transmission line at the second end thereof; and
- a variable capacitor electrically coupled to the electrically conductive strip of the second transmission line at the second end thereof.

10. The device of claim 9 wherein each transmission line comprises a microstrip.

11. The device of claim 9 wherein the second electrical connection joining the ground planes of the two transmission lines at the second ends thereof is additionally coupled to ground.

12. The device of claim 9 wherein the second electrical connection joining the ground planes of the two transmission lines at the second ends thereof is additionally coupled to a DC bias voltage.

13. The device of claim 7 further comprising
- a second differential power amplifier, having an input and an output, and configured to operate within a second frequency band and further configured to produce an amplified differential output signal at the output from a differential input signal received at the input, the second differential power amplifier being solely dedicated to the second frequency band; and
- a second impedance balancing circuit in electrical communication with the second differential power amplifier and configured to receive the differential output signal from the output of the second differential power amplifier and further configured to produce a single-ended output signal from the differential output signal, the second impedance balancing circuit being tunable to change an impedance applied to the output of the second differential power amplifier as the operating mode is switched.

* * * * *